United States Patent
Maddali

(10) Patent No.: US 8,484,524 B2
(45) Date of Patent: Jul. 9, 2013

(54) INTEGRATED CIRCUIT WITH SELF-TEST FEATURE FOR VALIDATING FUNCTIONALITY OF EXTERNAL INTERFACES

(75) Inventor: Srinivas Maddali, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 614 days.

(21) Appl. No.: 11/842,396

(22) Filed: Aug. 21, 2007

(65) Prior Publication Data

US 2009/0055695 A1    Feb. 26, 2009

Related U.S. Application Data

(60) Provisional application No. 60/943,935, filed on Sep. 10, 2007.

(51) Int. Cl.
*G01R 31/28* (2006.01)
*G06F 11/00* (2006.01)

(52) U.S. Cl.
USPC .......................... 714/736; 714/732; 714/734

(58) Field of Classification Search
USPC .................. 714/718, 724, 733, 734, 736, 738
See application file for complete search history.

(56) References Cited

U.S. PATENT DOCUMENTS

| | | | |
|---|---|---|---|
| 5,537,536 A * | 7/1996 | Groves .......................... | 714/28 |
| 5,574,733 A * | 11/1996 | Kim .............................. | 714/728 |
| 5,657,442 A * | 8/1997 | Groves .......................... | 714/28 |
| 5,909,593 A * | 6/1999 | Abbondonzio et al. ........ | 710/19 |
| 6,954,888 B2 | 10/2005 | Rajski et al. | |
| 7,418,642 B2 | 8/2008 | Taylor et al. | |
| 7,424,660 B2 | 9/2008 | Kebichi et al. | |
| 7,519,886 B2 * | 4/2009 | Tsao et al. ..................... | 714/733 |
| 2002/0183054 A1 * | 12/2002 | Rimoni et al. ................ | 455/423 |

(Continued)

FOREIGN PATENT DOCUMENTS

| | | |
|---|---|---|
| EP | 0778584 | 6/1997 |
| EP | 1282041 | 2/2003 |

(Continued)

OTHER PUBLICATIONS

Zorian, Y.; "Test requirements for embedded core-based systems and IEEE P1500," Test Conference, 1997. Proceedings., International, vol., no., pp. 191-199, Nov. 1-6, 1997.*

(Continued)

*Primary Examiner* — Ajay Bhatia
*Assistant Examiner* — Daniel McMahon
(74) *Attorney, Agent, or Firm* — Peter Michael Kamarchik; Nicholas J. Pauley; Joseph Agusta

(57) ABSTRACT

This disclosure describes an integrated circuit with self-test features for validating functionality of external interfaces. Example external interfaces include memory interfaces and bus interfaces, such as a peripheral component interconnect (PCI) bus, an advanced high-performance bus (AHB), an advanced extensible interface (AXI) bus, and other external interfaces that operate a high frequency, e.g., 200 MHz or greater. Test logic may be embedded on the integrated circuit and configured to validate functionality of external interfaces while receiving power and non-test signals from external test equipment. Thus, external test equipment may not supply high frequency test signals to the integrated circuit. The external test equipment may, however, independently validate functionality of a pin interface of the integrated circuit. As a result, the integrated circuit may reduce cost and time required to verify functionality and timing of the external interfaces.

53 Claims, 5 Drawing Sheets

U.S. PATENT DOCUMENTS

| | | |
|---|---|---|
| 2003/0023914 A1* | 1/2003 | Taylor et al. .................. 714/733 |
| 2005/0060626 A1 | 3/2005 | Rajski et al. |
| 2006/0190789 A1 | 8/2006 | Kebichi et al. |
| 2006/0265632 A1 | 11/2006 | Huang et al. |
| 2007/0074141 A1 | 3/2007 | Takei |

FOREIGN PATENT DOCUMENTS

| | | |
|---|---|---|
| JP | 4025955 A | 1/1992 |
| JP | 9223081 A | 8/1997 |
| JP | 10221410 A | 8/1998 |
| JP | 2007094591 A | 4/2007 |
| KR | 20030011650 A | 2/2003 |
| TW | I276107 B | 3/2007 |

OTHER PUBLICATIONS

International Search Report—PCT/US08/066744, International Search Authority—European Patent Office, Sep. 23, 2008.

Written Opinion—PCT/US08/066744, International Search Authority—European Patent Office, Sep. 23, 2008.

Chen P., et al., "The Research on Reseeding", Optoelectronic Technology & Information, vol. 18, No. 6, pp. 1-5, Dec. 31, 2005.

Taiwan Search Report—TW097122316—TIPO—Sep. 5, 2012.

* cited by examiner

INTEGRATED CIRCUIT WITH SELF-TEST FEATURE FOR VALIDATING FUNCTIONALITY OF EXTERNAL INTERFACES

This application claims the benefit of U.S. Provisional Application No. 60/943,935, filed Jun. 14, 2007, the entire content of which is incorporated herein by reference.

TECHNICAL FIELD

The disclosure relates to integrated circuits and, more particularly, to techniques for verifying functionality and timing of external interfaces for integrated circuits.

BACKGROUND

An integrated circuit (IC) device may comprise many miniaturized circuits implemented in a semiconductor substrate. IC devices are tested after manufacture in order to ensure proper operation before being sold and used commercially. Thorough testing of an IC device is typically accomplished using complex and expensive external testing equipment. In order to test an IC device, the IC device is mounted on test equipment. In particular, the IC device is connected to the test equipment via a pad ring that interconnects core logic to input/output (I/O) pins. In order to test the IC device, the test equipment delivers test data defining the test to the IC device via the I/O pins and acquires response signals from the IC device in accordance with the test defined by a test program.

Testing an IC device requires verifying functionality and timing for the external interfaces and internal interfaces of the IC device. Example external interfaces include memory interfaces and bus interfaces such as a peripheral component interconnect (PCI) bus, an advanced high-performance bus (AHB), an advanced extensible interface (AXI) interface bus, a small computer system interface (SCSI) bus, an Ethernet bus, a universal serial bus (USB), an advanced graphics processor (AGP) bus, a serial advanced technology attachment (SATA) bus, and other external interfaces that operate at high frequency. Verifying functionality and timing of external interfaces involves using a host computer to develop test programs and generate trace files for the external interface under test by running simulations. Once the trace files, also referred to as test vectors, vectors, or test data, are ready, the test data is loaded onto the test equipment. The test equipment supplies test signals to the IC device in accordance with the test data and acquires response signals from the IC device via the I/O pins.

During the test, the operation of the IC device is tested in both transmit and receive modes. In a transmit mode or receive mode the test equipment supplies signal transitions as per the test data and the IC device generates corresponding response signals. The test equipment then validates the responses as per the test data. Upon completion of the tests, the test equipment or, more specifically, the host computer, interprets the response signals. The host computer may interpret the results by comparing the response signals generated by the IC device in the transmit and receive modes to simulated results. The host computer generates a report that indicates whether or not the IC device passed the test based on the comparison.

In addition, for each test vector, the IC device may be tested for a variety of operational conditions, e.g., temperature, voltage variations, and process corners. Moreover, the test equipment may be required to generate signal transitions at or above the maximum operational frequency of the external interface. As the complexity and clock frequency of IC devices increases, the frequency at which test equipment channels operate also needs to increase to reliably test the IC device. For example, since the clock frequency of fast memory devices increases on an almost annual basis, test equipment needs to be upgraded, modified, or even replaced in order to test these devices at high operating frequencies. In other words, IC devices cannot be tested at their maximum clock frequency using older test equipment that was built for testing devices that operate at slower frequencies. Thus, test equipment must be upgraded or purchased and new test programs developed with each advance in clock frequency, thereby increasing the cost of new IC devices.

SUMMARY

This disclosure describes an integrated circuit with self-test features for validating functionality of high frequency external interfaces. Example external interfaces include memory interfaces and bus interfaces, such as a peripheral component interconnect (PCI) bus, an advanced high-performance bus (AHB), an advanced extensible interface (AXI) bus, and other external interfaces that operate at a high frequency, e.g., 200 MHz or greater. Test logic may be embedded on the integrated circuit and configured to validate functionality of external interfaces. For example, the test logic may be configured to validate external interface functionality while receiving power and non-test signals from external test equipment. Thus, the external test equipment may not supply high frequency test signals to the integrated circuit.

Validating functionality of an external interface generally refers to validating transactions transmitted over the external interfaces based on data associated with the transactions or based on whether or not the transactions are consistent with a corresponding protocol. External test equipment is used to supply power and essential signals to the integrated circuit as well as independently validate functionality of the pin interface of the integrated circuit. In this manner, the on-chip, self-test features of the integrated circuit may substantially eliminate the need for test equipment to supply high frequency test signals and, as a result, may reduce cost and time required to verify functionality and timing of the external interfaces.

In one aspect, an integrated circuit comprises a processor that executes instructions of a test program to initiate operation in one of a transmit and a receive mode, core logic that generates transactions for communicating with the processor and one or more external devices in accordance with the test program, and wherein the processor generates transactions for communicating with the core logic in accordance with the test program, and test logic that validates one or more of the transactions and outputs a status signal that indicates whether the one or more transactions is valid.

In another aspect, a method comprises executing instructions of a test program in a processor on an integrated circuit to initiate operation in one of a transmit mode and a receive mode, generating transactions in the processor to communicate with core logic on the integrated circuit in accordance with the test program, generating transactions in the core logic to communicate with the processor and one or more external devices in accordance with the test program, validating one or more of the transactions via test logic on the integrated circuit, and generating a status signal in the test logic that indicates whether the one or more transactions is valid.

In another aspect, an integrated circuit comprises means for executing instructions of a test program on an integrated circuit to initiate operation in one of a transmit mode and a receive mode, means for generating transactions in the processor to communicate with core logic on the integrated circuit in accordance with the test program, means for generating transactions in the core logic to communicate with the processor and one or more external devices in accordance with the test program, means for validating one or more of the transactions via test logic on the integrated circuit, and means for generating a status signal that indicates whether the one or more transactions is valid.

In another aspect, a computer-program product comprises a computer-readable medium having instructions thereon. The instructions comprise code for executing instructions of a test program on an integrated circuit to initiate operation in one of a transmit mode and a receive mode, code for generating transactions in the processor to communicate with core logic on the integrated circuit in accordance with the test program, code for generating transactions in the core logic to communicate with the processor and one or more external devices in accordance with the test program, code for validating one or more of the transactions via test logic on the integrated circuit, and code for generating a status signal that indicates whether the one or more transactions is valid.

In another aspect, a system comprises an integrated circuit and test equipment that supplies power and a clock signal to the integrated circuit. The integrated circuit includes a processor that executes instructions of a test program to initiate operation in one of a transmit mode and a receive mode, core logic that generates transactions for communicating with the processor and one or more external devices in accordance with the test program, and wherein the processor generates transactions for communicating with the core logic in accordance with the test program, and test logic that validates one or more of the transactions, and outputs a status signal that indicates whether the one or more transactions is valid.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium and loaded and executed in the processor. Accordingly, this disclosure also contemplates a computer-readable medium comprising instructions that upon execution cause the device to perform techniques as described in this disclosure. In some cases, the computer readable medium may form part of a computer program product comprising computer readable medium.

The details of one or more aspects of this disclosure are set forth in the accompanying drawings and the description below. Other features, objects, and advantages of the disclosure will be apparent from the description and drawings, and from the claims.

DETAILED DESCRIPTION

Figure 1:
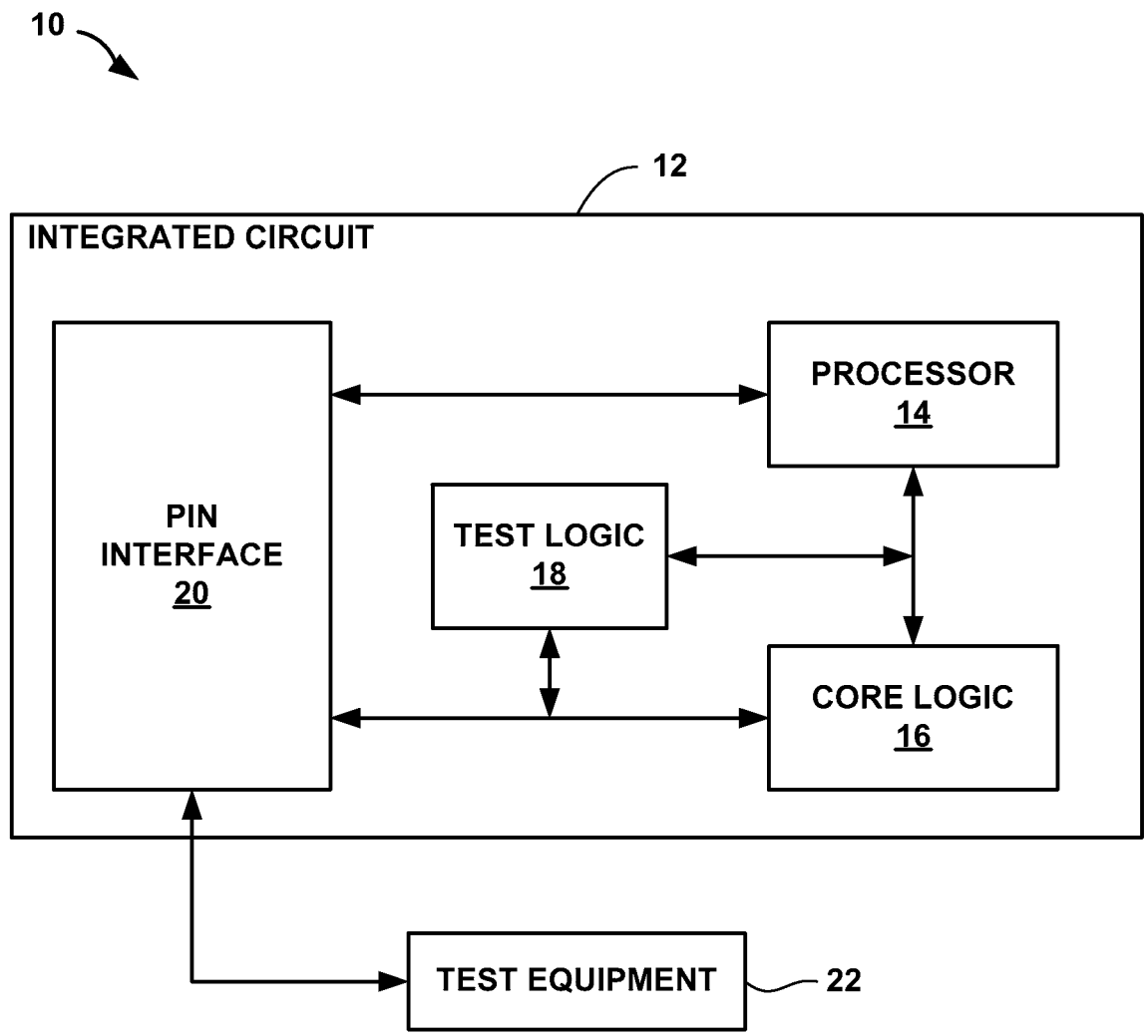
FIG. 1 is a block diagram illustrating an integrated circuit with self-test features and external test equipment for testing the integrated circuit.

Integrated circuits are tested after manufacture in order to ensure proper operation before being sold and used commercially. Testing an integrated circuit may involve validating functionality of external interfaces used for communicating with external devices. Generally, a host computer is used to develop test programs and run simulations to generate trace files for the external interfaces. Once the trace files, also referred to in this disclosure as test vectors, vectors, or test data, are created, they are loaded onto test equipment which supplies test signals to the integrated circuit in accordance with the test data.

Testing an integrated circuit in this manner can be time consuming since it requires a large number of test vectors to cover the complex functionality of the external interfaces of the integrated circuit. Moreover, testing can be expensive because the test equipment must support the highest frequency of operation of the integrated circuit to verify the timing of the external interface. Since the complexity and clock frequency of integrated circuits frequently increases, the capabilities of external test equipment can become a limiting factor in testing new integrated circuits. That is, older test equipment that was built for testing an integrated circuit operating at a slower frequency cannot be used to test new integrated circuits at their higher operating frequencies. Acquiring new external test equipment capable of testing integrated circuits at higher and higher frequencies is costly and may require additional time.

This disclosure describes an integrated circuit with self-test features for validating functionality of high frequency external interfaces. Example external interfaces include memory interfaces and bus interfaces, such as a peripheral component interconnect (PCI) bus, an advanced high-performance bus (AHB), an advanced extensible interface (AXI) bus, a small computer system interface (SCSI) bus, an Ethernet bus, a universal serial bus (USB), an advanced graphics processor (AGP) bus, a serial advanced technology attachment (SATA) bus, and other external interfaces that operate at high frequency, e.g., 200 MHz or greater. In accordance with various aspects of this disclosure, test logic may be embedded on the integrated circuit and configured to validate functionality of external interfaces. In some aspects, the test logic may be configured to validate external interface functionality while receiving power and non-test signals from external test equipment. Thus, the external test equipment may not supply high frequency test signals to the integrated circuit.

Validating functionality of an external interface refers to validating transactions transmitted over the external interfaces based on data associated with the transactions or based on whether or not the transactions are consistent with a corresponding protocol. External test equipment is used to supply power and non-test signals, i.e., signals essential to the operation of the integrated circuit, to the integrated circuit as well as independently validate functionality of the pin interface of the integrated circuit. In this manner, the on-chip, self-test features of the integrated circuit may substantially eliminate the need for test equipment to supply high frequency test signals and, as a result, may reduce cost and time required to verify functionality and timing of the external interfaces.

FIG. 1 is a block diagram illustrating a system 10 for validating functionality of high frequency external interfaces of an integrated circuit 12. As shown in FIG. 1, system 10 includes integrated circuit 12 and test equipment 22. In general, integrated circuit 12 includes self-test features that substantially eliminate the need for test equipment 22 to supply high frequency test signals for validating the functionality of the high frequency external interfaces. Consequently, test equipment 22 may be relatively low cost test equipment that supplies power and non-test signals, i.e., signals essential for operation, to integrated circuit 12 during the testing process.

Integrated circuit 12 may comprise one or more miniaturized circuits implemented in a semiconductor substrate, such as a silicon chip. In general, integrated circuit 12 may be an application-specific integrated circuit (ASIC) or a general purpose integrated circuit that communicates with external devices (not shown) via one or more external interfaces. For example, integrated circuit 12 may be configured for use in a personal computer, a laptop computer, a personal digital assistant (PDA), an ultra mobile personal computer (UMPC), a mobile telephone handset, a networking device, or other electronic device. Integrated circuit 12 may be configured to communicate with external devices such as system memory, a disk drive, a keyboard, a monitor or display, a mouse, a printer, a scanner, an external storage device, and other external input/output (I/O) devices via one or more external interfaces. Thus, it should be understood that integrated circuit 12 may be any integrated circuit configured to communicate with at least one external device, i.e., an electrical component located off of the semiconductor substrate.

In FIG. 1, integrated circuit 12 includes processor 14, core logic 16, test logic 18, and pin interface 20, and is mounted on test equipment 22. Processor 14 is a programmable processor that executes computer program instructions stored in local memory and processes data as directed by the stored instructions. For example, processor 14 may be a microprocessor, microcontroller, digital signal processor (DSP), application specific integrated circuit (ASIC), field programmable gate array (FPGA), discrete logic circuitry, or a combination of such components.

Processor 14 generally operates in a transmit mode or a receive mode. In one example, processor 14 operates in a transmit mode and a receive mode to write data to and receive data from an external device (not shown). In other examples, processor 14 may operate in transmit and receive mode without writing data to or reading data from an external device. Transactions generated in a transmit mode and a receive mode may be referred to in this disclosure as write transactions and read transactions, respectively. When operating in a transmit mode, processor 14 generates write transactions, also referred to as request transactions, and sends the request transactions to core logic 16. As an example, a request transaction may identify an external device and include data that is to be written to the external device.

Processor 14 operates in a similar manner when operating in a receive mode. That is, processor 14 generates read transactions and sends the read transactions to core logic 16. In either case, i.e., when operating in a transmit or a receive mode, processor 14 generates the request transaction in accordance with a protocol assigned to core logic 16. As will be described in greater detail, core logic 16 may comprise different blocks that communicate according to different protocols. Accordingly, processor 14 generates transactions according to the protocols for the corresponding blocks of core logic 16.

Core logic 16 provides external interfaces for transmitting data between processor 14 and one or more external devices (not shown). In particular, core logic 16 manages communication between processor 14 and the external devices by generating transactions in accordance with the protocol associated with the corresponding external interface and routing transactions between processor 14 and the external devices. For example, when operating in a transmit mode, core logic 16 generates write transactions and routes the write transactions to the appropriate external device per a write (request) transaction received from processor 14. Core logic 16 may, in some cases, send a response message to processor 14 to confirm the write transaction. Core logic 16 may also receive a message from the external device in response to the corresponding write transaction sent to the external device. Where core logic receives a message from the external device, core logic 16 may process the message and send an appropriate response to processor 14.

Likewise, when operating in a receive mode, core logic 16 processes read (request) transactions received from processor 14 and generates corresponding read transactions which it sends to the appropriate external interface device. Core logic 16 generates the read transactions according to a protocol associated with the external device. In response to the read transaction, core logic 16 receives a message from the external device. Core logic 16 processes the message and sends a corresponding message to processor 14. In some cases, core logic 16 may also send a message to processor 14 in response to the read transaction received from processor 14.

Core logic 16 and one or more external devices may communicate over a single bus or a collection of busses. Each bus may couple core logic 16 to one or more external devices and have a different architecture that operates in accordance with a particular protocol, timing, and bandwidth capability. Example bus architectures that may be used to interconnect integrated circuit 12 to external devices include a memory bus, an Industry Standard Architecture (ISA) bus, an Enhanced ISA (EISA) bus, a Peripheral Component Interconnect (PCI) bus, an Advanced Graphics Processor (AGP) bus, a universal serial bus (USB), an Advanced High-Performance Bus (AHB), an Advanced Extensible Interface (AXI) bus, an Advanced Technology Advancement (ATA) bus, a small computer system interface (SCSI) bus, an Ethernet bus, a universal serial bus (USB), and a serial advanced technology attachment (SATA) bus. Other bus architectures may be used for coupling integrated circuit 12 to external devices. Core logic 16 and processor 14 may communicate over one or more separate busses. In one example, a separate dedicated bus, referred to as a frontside bus, carries transactions between processor 14 and core logic 16.

As one example, integrated circuit 12 may be used within a personal computer. In this example, core logic 16 may manage communication between processor 14, which operates as a central processing unit (CPU), and system memory via a high frequency memory bus. Core logic 16 may also manage communication between processor 14 and one or more of a keyboard, a monitor, and a mouse via an ISA bus. Additionally, core logic 16 may manage communication between processor 14 and one or more of an Ethernet expansion card, a small computer system interface (SCSI) card, or other PCI cards via a PCI bus. Moreover, core logic 16 may manage communication between processor 14 and a dedicated video processor via an AGP bus, communication between processor 14 and a CD-ROM or other hard disk via an ATA bus, and communication between processor 14 and one or more of a printer, a scanner, an external mass storage device, or other USB compatible peripheral device via a USB.

In operation within a personal computer, integrated circuit 12 may retrieve a file stored in a memory module, e.g., a hard disk drive, a flash disk drive, or a removable memory card, and display the file on a monitor. In this case, integrated circuit 12 may utilize a first external interface to communicate with the disk module, a second external interface to communicate with system memory, and a third external interface to communicate with the display monitor. Each of the external interfaces may communicate according to a different protocol. For example, integrated circuit 12 initially follows a protocol associated with the disk module to request a file. When the disk module receives the request, it provides the file to integrated circuit 12. Integrated circuit 12 then writes the file to system memory adhering to the system memory protocol for storing data. When integrated circuit 12 is ready to display the file on the monitor, integrated circuit 12 reads data from the system memory and writes it to the display monitor following the appropriate protocol for the display monitor. Integrated circuit 12 must follow the protocol to read data from and write data to these different modules. If the protocol is not followed, the modules will not store or provide the correct data.

As another example, integrated circuit 12 may be configured for use in a wireless communication device, such as a mobile radiotelephone handset. In this example, integrated circuit 12 may be a mobile station modem (MSM) chip in which core logic 16 manages communication between processor 14 and system memory via a memory bus, a keypad via an ISA bus, a removable storage device such as removable memory card via a USB bus, a display screen via a PCI bus, and a camera module via a different PCI bus, and the like. In this example, processor 14 may operate as a universal mobile telecommunications system (UMTS), a global system for mobile communications (GSM), a code-division multiple access (CDMA) protocol, and/or a general packet radio service (GPRS) processor.

When integrated circuit 12 is configured for operation as an MSM chip, integrated circuit 12 may interface with a camera module, a memory module, a system memory, and a display screen to take a picture. Integrated circuit 12 may interface with each of these external devices in accordance with a different protocol. For example, integrated circuit 12 follows the protocol associated with the camera module to initiate communication with the camera module to capture a picture. Once the camera module has captured the picture, integrated circuit 12 reads the captured image data and sends a request to system memory to write the image data to the system memory. Processor 14 may process the image data while it is in the system memory. When processing is complete, integrated circuit 12 reads the data from the system memory following the system memory protocol and transfers the image to the display screen. If the user requests to store the image, integrated circuit 12 transfers the image to the disk drive. Again, integrated circuit 12 communicates with each of the external interfaces of the MSM chip, such as a camera interface, system memory interface, display interface, flash card/disk drive interface, according to a different protocol. For this reason, integrated circuit 12 validates functionality post manufacture by testing communication over each external interface.

Core logic 16 provides one or more external interfaces, i.e., manages communication between processor 14 and at least one external device. In particular, core logic 16 and processor 14 may communicate with each other according to a single protocol. Core logic 16, however, may communicate with each of the external interfaces according to respective protocols different than the protocol used for communicating with processor 14. In other words, core logic 16 may communicate with processor 14 according to a first protocol to receive a transaction request to, for example, write data to system memory, and communicate with processor 14 according to a second protocol to send a transaction to the system memory for writing data to the system memory. Thus, core logic 16 is responsible for generating transactions according to the appropriate protocol.

In some examples of this disclosure, at least one of the external interfaces is a high frequency external interface. A high frequency external interface may operate at a frequency of approximately 200 MHz or greater, within a range of approximately 200 MHz to approximately 400 MHz, or at a frequency of approximately 400 MHz or greater. PCI, AHB, and AXI buses are exemplary high frequency external interfaces. With respect to the examples of the personal computer and wireless communication device discussed above, the memory bus, PCI bus, AGP bus, ATA bus, and USB buses may be high frequency interfaces. Other high frequency external interfaces include EISA busses, AHB busses, AXI busses, ATA busses, Ethernet busses, SCSI busses, and SATA busses.

Test logic 18 is embedded on the semiconductor substrate of integrated circuit 12 and configured to validate functionality of the high frequency external interfaces of integrated circuit 12. Validating the functionality of the high frequency external interfaces refers to validating transactions transmitted over the high frequency interfaces. In one example aspect, test logic 18 may validate the transactions based on data associated with the transactions. In another aspect, test logic 18 may validate the transactions based on whether or not the transactions are consistent with the protocol associated with transactions. When validating the transactions based on whether or not the transactions are consistent with the protocol, test logic 18 may also validate the transactions based on data associated with the transactions.

In order to validate a transaction, test logic 18 first snoops the communication channel or bus over which the transaction is sent. As will be described in greater detail, test logic 18 may snoop the communication channel or bus between processor 14 and core logic 16 or the communication channel or bus between core logic 16 and pin interface 20. In any case, when test logic 18 has obtained the transaction, the test logic 18 examines the transaction to determine if the transaction is valid or not. The transaction may be examined, for example, by comparing data associated with the transaction to reference data or by determining if the transaction is consistent with the associated protocol. In one example, determining if the transaction is consistent with the associated protocol may involve checking control signals defined by the protocol. In other examples, determining if the transaction is consistent with the associated protocol does not require checking control signals. In any case, test logic 18 outputs a status signal that indicates whether or not the transaction is valid, i.e., passed or failed the validity test. This signal is output, for example, via a designated pin of pin interface 20. A user can then view the status signal on a display monitor of a host computer that interfaces with test equipment 22 to determine whether or not integrated circuit 12 is functional.

Validating functionality of high frequency external interfaces of integrated circuit 12, as described in this disclosure, does not require test equipment 22 to supply high frequency signals to integrated circuit 12. Rather, test equipment 22 is used to load a test program to local memory of processor 14. Processor 14 executes the test program which causes integrated circuit 12 to simulate operation in transmit and receive modes. In other words, the test program includes instructions that, when executed by processor 14, cause processor 14 and core logic 16 to generate write and read transactions which are sent over one or more external interfaces. Test logic 18 snoops the communication channels of integrated circuit 12 to obtain the transactions, and examines the transactions to determine their validity. In this way, test logic 18 validates that processor 14 and core logic 16 follow the corresponding protocol when communicating over each of the external interfaces. As a result, testing is completed on-chip for various operating conditions and does not require manual work that would otherwise be required to set up and/or initiate tests for each set of operating conditions. This reduces time and cost required to verify functionality and timing of the external interfaces. Additionally, test equipment 22 may be low cost equipment that supplies non-test signals, such as power, ground, and clock signals, e.g., a system clock, a system reset, and the like, to integrated circuit 12 and is used to load a test program to integrated circuit 12. In this manner, test equipment 22 need not be modified and updated to provide high frequency test signals.

Although integrated circuit 12 is described in this disclosure as validating functionality of high frequency interfaces, test logic 18 may be used to validate functionality of external interfaces operating at any frequency. This is because in addition to the high cost of upgrading existing test equipment or purchasing new test equipment to validate functionality of high frequency external interfaces, validating the functionality of external interfaces operating at any frequency can be a complex and time consuming task since each external interface is often tested over all possible operating conditions, e.g., supply voltage range, temperature range, and process corners. Additionally, variations between integrated circuits require manual changes to be made to the test program.

It is recognized, however, that because test logic 18 does occupy additional real estate on the semiconductor substrate, it may be desirable to validate external interfaces that operate at a lower frequency, e.g., less than 200 MHz, by supplying test signals via the test equipment. This is dependent on the trade-off between the cost of substrate space allotted to the test logic and the cost of testing without using the self-test features described in this disclosure. In other words, a trade-off exists between the cost of real estate on the semiconductor substrate which test logic 18 occupies and the cost associated with using test equipment to supply signals for validating functionality of external interfaces in accordance with techniques well known in the art at the time of this disclosure. Consequently, it should be understood that the self-test features for validating functionality of external interfaces described in this disclosure may be used to validate functionality of external interfaces operating at any frequency, but may be particularly useful for external interfaces operating at high frequency, e.g., 200 MHz or greater.

Figure 2:
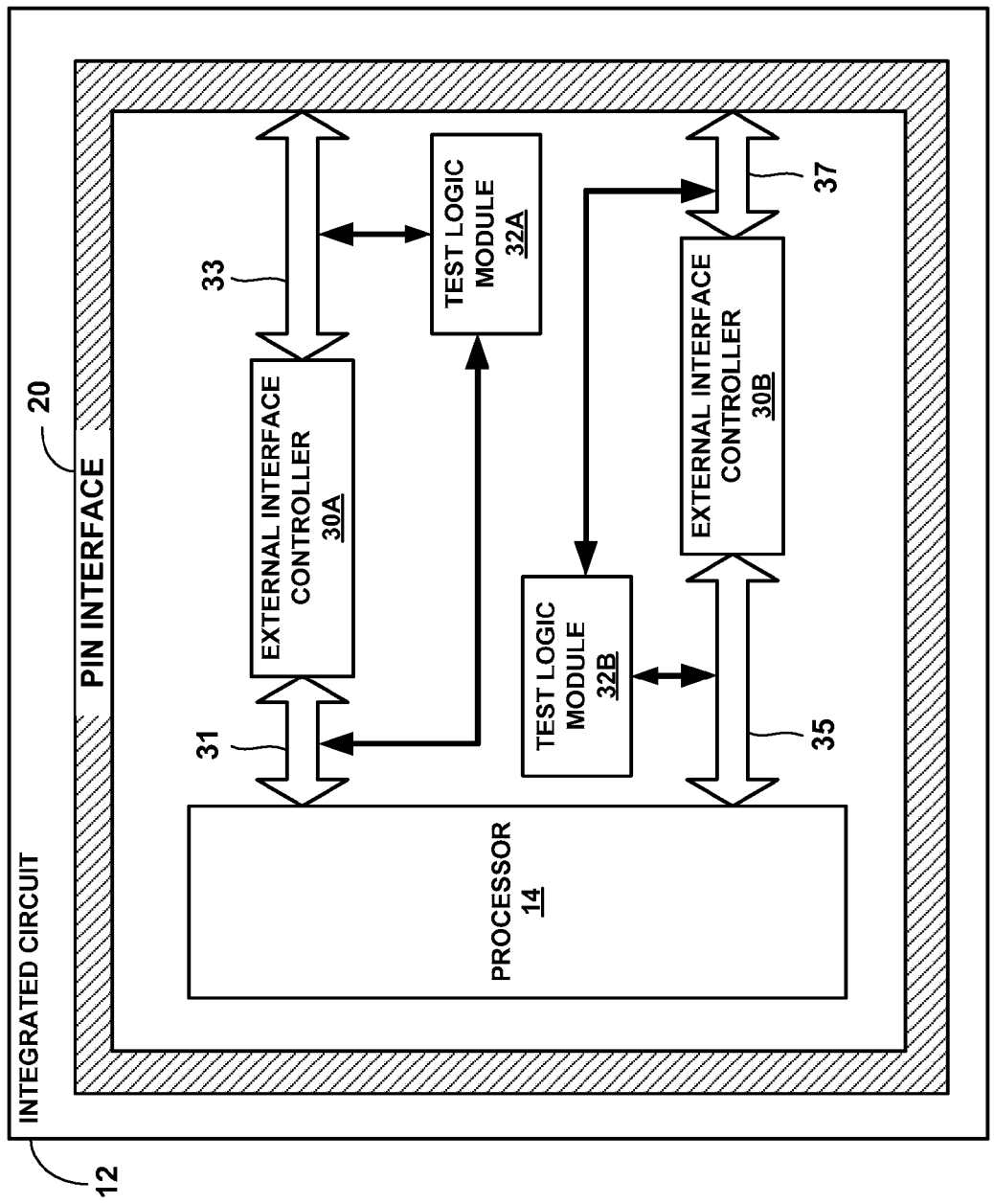
FIG. 2 is a block diagram illustrating the integrated circuit of FIG. 1 in greater detail.

FIG. 2 is a block diagram illustrating integrated circuit 12 in greater detail. In particular, integrated circuit 12 is illustrated in FIG. 2 as including external interface controllers 30A and 30B and test logic modules 32A and 32B. External interface controllers 30A and 30B correspond to core logic 16 in FIG. 1. That is, external interface controllers 30A and 30B represent separate blocks or modules of core logic 16 associated with different external interfaces. For example, external interface controller 30A may manage communication over one type of high frequency external interface, such as a PCI bus, and external interface controller 30B may manage communication over a different type of high frequency external interface, such as an AGP bus. External interface controllers 30A and 30B may manage communication with the respective external devices according to different protocols. In FIG. 2, external interface controller 30A communicates with processor 14 via bus 31 and the corresponding external device (not shown) via bus 33. External interface controller 30B communicates with processor 14 via bus 35 and the corresponding external device (not shown) via bus 37. It should be understood, however, that processor 14 and external interface controllers 30A and 30B may share part of one or more busses. That is, although FIG. 2 depicts communication channels referred to as busses 31, 33, 35, and 37, these communication channels may represent a single or multiple busses. As an example, buses 31 and 35 may be a single bus, referred to as a front-side bus, that provides a channel between processor 14 and the core logic which may include a plurality of external interface controllers.

In a similar fashion, test logic modules 32A and 32B represent separate blocks or modules of test logic 18 associated with different external interfaces. Each of test logic modules 32A and 32B validates functionality of the corresponding high frequency external interface. In FIG. 2, test logic module 32A is associated with external interface controller 30A and test logic module 32B is associated with external interface controller 30B.

Test logic module 32A may snoop bus 31, bus 35, or both. For example, test logic module 32A may snoop bus 31 to validate transactions generated by processor 14 when operating in a transmit mode or a receive mode. In another example, test logic module 32A may snoop bus 31 to validate transactions generated by external interface controller 30A and sent to processor 14 in a transmit mode or a receive mode. Where external interface controller 30A generates a transaction that is sent to processor 14 in a receive mode, test equipment 22 (not shown in FIG. 2) does not provide or check high frequency signals. Rather, test logic module 32A sends data and other signals as required by the protocol to external interface controller 30A based on a seed value provided by processor 14.

External interface controller 30A generates a corresponding read transaction based on the data and other signals received from test logic module 32A and sends the read transaction to processor 14. In this way, test logic module 32A operates in a similar fashion as typical test equipment in that test logic module 32A emulates operation of an external device, i.e., provides external interface controller 30A with appropriate data and signals. This is described in greater detail with respect to FIG. 3. In an additional example, test logic module 32A may snoop bus 33 to validate transactions generated by external interface controller 30A and sent to pin interface 20 in a transmit mode or a receive mode.

Test logic module 32B may operate in a similar manner to validate transactions transmitted over the external interface associated with external interface controller 30B. That is, test logic module 32B may snoop bus 35, bus 37, or both to validate transactions transmitted over the corresponding external interface in a transmit or receive mode.

In each of these examples, test logic modules 32A and 32B may validate transactions based on data associated with the transactions or based on whether or not the transactions are consistent with the associated protocol. Validating the transactions based on whether or not the transactions are consistent with the associated protocol may involve validating that the transactions are generated in accordance with the rules defined by the protocol. Rules defined by the protocol may include rules defining data representation, signaling, authentication, error detection, and error handling. Test logic modules 32A and 32B may also validate the transactions based on the associated data when validating the transactions based on whether or not the transactions are consistent with the associated protocol. The validation process employed by integrated circuit 12 is described in detail with respect to the block diagram illustrated in FIG. 3 and the flowcharts illustrated in FIGS. 4 and 5.

Although FIG. 2 illustrates integrated circuit 12 as including two high frequency external interfaces comprising test modules 32A and 32B and external interface controllers 30A and 30B, integrated circuit 12 may include one or more external interfaces. Thus, it should be understood that FIG. 2 is merely exemplary and should not be considered limiting of the disclosure in any way. Rather, the purpose of FIG. 2 is to illustrate the relationship between external interfaces of an integrated circuit and test logic that is embedded on the integrated circuit for validating the functionality of the external interfaces.

Figure 3:
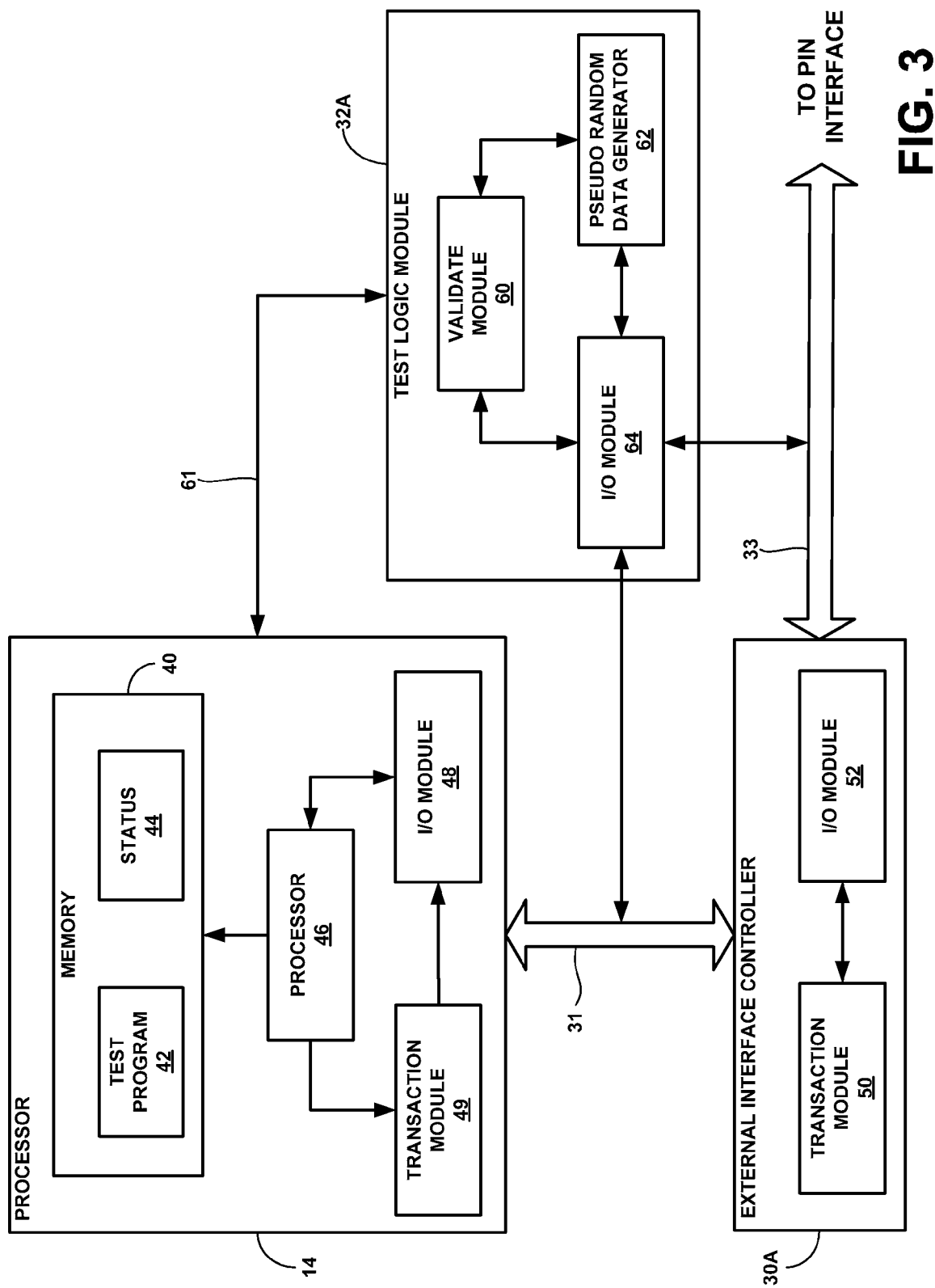
FIG. 3 is a block diagram illustrating exemplary components of the integrated circuit in FIG. 2 in greater detail.

FIG. 3 is a block diagram illustrating components of integrated circuit 12 in greater detail. In particular, FIG. 3 illustrates processor 14, external interface controller 30A and test logic module 32A in greater detail. Processor 14 and external interface controller 30A cooperatively operate to provide an external interface for performing read and write operations to, for example, write data to and read data from an external device (not shown). In particular, processor 14, external interface controller 30A, and the corresponding external device communicate with each other according to respective protocols. That is, processor 14 and external interface controller 30A communicate with each other according to a particular protocol and external interface controller 30A and the external device communicate with each other according to a different protocol. Test logic module 32A provides features for validating the functionality of the external interface without requiring external test equipment, such as test equipment 22, to supply and check high frequency signals. In one aspect, for example, test logic module 32A validates transactions generated by one or both of processor 14 and external interface controller 30A based on data associated with the transactions. In another example aspect, test logic module 32A validates the transactions generated by one or both of processor 14 and external interface controller 30A based on whether or not the transactions are consistent with the associated protocol.

Processor 14 includes memory 40, processor 46, input output (I/O) module 48, and transaction module 49. Memory 40 stores test program 42 and status 44. Test program 42 is loaded to memory 40 by a host computer via test equipment 22 (not shown) and contains instructions that, when executed by processor 46, initiate operation in a transmit mode or a receive mode. When operating in a transmit mode or a receive mode, processor 14 may, in some examples, perform operations for writing data to an external device or for reading data from the corresponding external device. In other examples, processor 14 may perform operations when operating in a transmit or receive mode that do not require writing data to or reading data from an external device. Generally, processor 46 processes data and controls operation of transaction module 49 and I/O module 48 per the instructions of test program 42.

When operating in a transmit mode, for example, transaction module 49 generates write transactions under the control of processor 46. Example write transactions include a request to write data to a system memory, a request to a camera module to capture an image, and a request to a monitor to display data. A write transaction for writing data to an external device may include information identifying the external device and the data to be written to the external device.

Processor 46 also controls transaction module 49 to generate read transactions when operating in a receive mode. Read transactions may include requests to retrieve data from a memory, such as a hard disk or a removable memory card, requests to retrieve image data captured by a camera module of a handheld device, and a request to retrieve data from a peripheral device.

I/O module 48 sends write and read transactions to external interface controller 30A via bus 31. Bus 31 may be a front-side bus over which processor 14 communicates with external interface controller 30A and additional external interface controllers. Alternatively, bus 31 may be a dedicated bus for communication between processor 14 and external interface controller 30A.

External interface controller 30A processes write and read transactions received from processor 14 and sends corresponding write and read transactions to a corresponding external device in real world environment. In a test environment, external interface controller 30A sends the corresponding transactions to a designated pin of interface 20. The following describes operation of external interface controller 30A with respect to operation in a transmit mode. Operation of external interface controller 30A in a receive mode will be described separately to avoid confusion.

In FIG. 3, external interface controller 30A includes transaction module 50 and I/O module 52. I/O module 52 manages I/O for external interface controller 30A. I/O module directs write transactions received over bus 31 to transaction module 52 and applies the corresponding write transactions generated by transaction module 50 to bus 33. During testing, bus 33 is coupled to a designated pin of pin interface 20 (not shown).

Transaction module 50 processes data contained in the received write transaction and generates a corresponding write transaction that I/O module 52 applies to bus 33. Since external interface controller 30A communicates with processor 14 and the corresponding external in device according to different protocols, transaction module 50 generates transactions according to the appropriate protocol. In this way, transaction module 50 can be viewed as converting transactions from one protocol to another. Accordingly, the transaction module of each external interface controller may generate transactions according to the protocol associated with the corresponding external interface. This is the reason that core logic 16 (shown in FIG. 1) can be viewed as including multiple external interface controllers, such as controllers 30A and 30B in FIG. 2. Thus, transaction module 50 translates a write transaction received from processor 14 to the protocol associated with the corresponding external device.

As previously described, external interface controller 30A may, in a first example, send a response message to processor 14. In such examples, transaction module 50 generates the response message and I/O module 52 sends the response message to processor 14 over bus 31.

In a second example, external interface controller 30A may receive a response message from the corresponding external device in normal operation, i.e., when operating in a real-world environment. During testing, however, external interface controller 30A receives the response message from test logic module 32A. That is, test logic module 32A causes external interface controller 30A to generate and send a corresponding response message to processor 14 by, for example, supplying data and other signals as required by the protocol to external interface controller 30A. With respect to FIG. 3, I/O module 52 receives the data and other signals from test logic module 32A over bus 33 and directs it to transaction module 50 which generates the corresponding response message. I/O module 52 sends the corresponding response message to processor 14 over bus 31.

In a third example, external interface controller 30A may send response messages in accordance with the first and second examples. That is, external interface controller 30A may send a first response message to processor 14 in response to receiving a write transaction received from processor 14 and send a second response message to processor 14 in response to receiving a third response message that corresponds with a write transaction sent to an external device by external interface controller 30A.

In a fourth example, external interface controller 30A does not generate any response signals. External interface controller 30A may operate in accordance with any of these examples. Thus, testing external interface controller 30A may involve validating operation of external interface controller 30A according to each of the examples.

Test logic module 32A validates the functionality of the external interface provided by processor 14 and external interface controller 30A in a transmit mode and a receive mode. Test logic module 32A also provides data and other signals required by the associated protocol to external interface controller 30A to emulate operation of an external device. By using test logic module 32A to supply the data and signals instead of external test equipment, external test equipment is not needed to operate at high frequency and, therefore, may not need to be modified, upgraded, or replaced as integrated circuit devices are required to be tested at progressively increasing operating frequencies.

In operation, processor 14 initiates or enables test logic module 32A. That is, processor 46 generates a control signal in accordance with test program 42 which I/O module 48 sends to test logic module 32A via dedicated wire connection 61. Prior to receiving the control signal, test logic module 32A may be disabled, i.e., inactive. Accordingly, processor 14 may send the control signal to test logic module 32A prior to sending a write transaction to external interface controller 30A. In response to receiving the control signal, however, test logic module 32A may actively snoop busses 31 and 33. In this way, test logic module 32A can obtain all transactions sent over the busses and, therefore, can determine if too many or too few transactions were transmitted in addition to validating transactions that are transmitted at the proper time.

In FIG. 3, test logic module 32A includes a validate module 60, a pseudo random data generator 62, and an I/O module 64 and receives the control signal from processor 14 via dedicated wire connection 61. I/O module 64 snoops busses 31 and 33 in a transmit mode to intercept write transactions generated by processor 14 and external interface controller 30A, respectively. I/O module 64 may also snoop bus 31 to retrieve response messages or transactions that are sent to processor 14 by external interface controller 30A.

The control signal includes a seed value that is used by test logic module 32A to generate reference data. In particular, pseudo random data generator 62 receives the seed value from I/O module 64 and uses the seed value to generate reference data that matches data specified by test program 42, i.e., data associated with the write transaction generated by processor 14. Pseudo random data generator 62 outputs the reference data to validate module 60 which compares the reference data to the data associated with the intercepted transaction, i.e., write transaction intercepted on bus 31. In examples in which test logic module 32A validates transactions based on whether or not the transactions are consistent with the protocol, validate module 60 may check the data after checking the protocol.

An example protocol may define a signal that is used to indicate when data is being transferred. The signal may have a first state that indicates data transfer is in progress and a second state that indicates that data transfer is not in progress. Thus, validate module 60 may check the data of the transaction provided by I/O module 64 only when the control signal is in the first state. By validating the data when the control signal is in the first state, validate module 60 validates that the transaction is consistent with the protocol and the data associated with the transaction. In this way, validate module 60 can determine when the transaction is consistent with the protocol and the data is valid, when the transaction is consistent with the protocol and the data is invalid, and when the transaction is not consistent with the protocol. However, when validate module 60 only checks the data associated with a transaction, the data may be valid but the transaction may not be consistent with the protocol. For this reason, validating the transaction based on whether or not the transaction is consistent with the protocol may provide a more accurate test for determining the functionality of the external interface. The foregoing description is an example used to provide a simple descriptive illustration of validating transactions and should not be considered limiting of the disclosure in any way. Rather, it should be understood that a protocol may define multiple signals and, in such cases, define multiple states are checked to validate a transaction. When multiple states are defined, validating a transaction may involve checking the one or more states or checking a sequence of one or more states.

Validate module 60 generates a status signal that indicates the status of the transaction. When validate module 60 validates the transaction based on the associated data, the status signal may indicate whether or not the transaction passed or failed. However, when validate module 60 validates the transaction based on whether or not the transaction is consistent with the protocol, the status signal may indicate that the transaction is consistent with the protocol and the data is valid, when the transaction is consistent with the protocol and the data is invalid, and when the transaction is not consistent with the protocol.

In FIG. 3, validate module 60 outputs the status signal over dedicated wire connection 61. Processor 14 updates status 44 based on the received signal. In particular, I/O module 48 directs the status signal to processor 46 which updates status 44 in memory 40. Status 44 is a parameter that indicates the status of the external interface. For example, status 44 may store a "PASS" value if the transaction is consistent with the protocol and the data is valid, a "DATA ERROR" value if the transaction is consistent with the protocol but the data is invalid, or a "PROTOCOL ERROR" value if the transaction is not consistent with the protocol. In this case processor 14 may generate a signal based on the value stored in status 44 that is read by test equipment 22 (not shown in FIG. 3) and displayed to a user via a host computer coupled to test equipment 22. In an alternative aspect, validate module 60 may send the status signal to I/O module 64 which outputs the status signal directly to a designated pin of pin interface 20.

Test logic module 32A uses a similar process to validate write transactions generated by external interface controller 30A. That is, I/O module 64 snoops bus 33 to intercept the write transaction and validate module 60 compares the data associated with the intercepted transaction to the reference data generated by pseudo random data generator 62. Validate module 60 then outputs a status signal based on the comparison.

As previously described, in some example aspects, external interface controller 30A sends a response message to processor 14 in response to receiving a response message from an external device. In such example aspects, test logic module 32A may also, in some example aspects, external interface controller 30A may, in response to receiving or validating the write transaction generated by external interface controller 30A, provide data and other signals required by the associated protocol to external interface controller 30A that emulate a response message which would generated by an external device in normal operation. In this way, test logic module 32A provides the functionality that is typically provided by external test equipment and test equipment 22 (not shown in FIG. 3) can be implemented as low cost test equipment. With respect to FIG. 3, validate module 60 may generate the response message, i.e., data and other signal required by the protocol, and I/O module 64 sends the response message to external interface controller 30A over bus 33.

External interface controller 30A sends a corresponding response message to processor 14 over bus 31. Test logic module 32A snoops bus 31 to intercept and validate the response message sent to processor 14 using the techniques provided in the foregoing description.

The foregoing description relates to operation of integrated circuit 12 in a transmit mode. The following description relates to operation of integrated circuit 12 in a receive mode. In order to validate the functionality of the external interface when operating in a receive mode, integrated circuit 12 validates transactions generated by processor 14 and external interface controller 30A in a receive mode based on data associated with the transaction or based on whether or not the transaction is consistent with the associated protocol. This requires validating read transactions generated by processor 14 that are sent to external interface controller 30A, read transactions generated by external interface controller 30A that are sent to pin interface 20, and response messages generated by external interface controller 30A that are sent to processor 14. As previously described, external interface controller 30A may also, in some example aspects, generate and send a response message to processor 14 that corresponds to a read transaction received from processor 14. In such example aspects, this response message is also validated.

When operating in a receive mode, processor 14 generates a read transaction according to test program 42 and sends the read transaction to external interface controller 30A which sends a corresponding read transaction to an external device. Test logic module 32A validates the read transactions using techniques similar to those used for validating write transactions generated in a transmit mode. Where external interface controller 30A sends a response message to processor 14 after receiving a read transaction from processor 14, test logic module 32A also uses the same validation techniques to validate the response message.

When operating in a receive mode, however, external interface controller 30A receives a response message from the external device that corresponds to the read transaction sent to that same external device. During testing, test logic module 32A supplies data and other signals required by the protocol to external interface controller 30A because external test equipment 22 does not provide high frequency signals. Thus, test logic module 32A operates in a similar manner as typical test equipment in that test logic module 32A supplies data and other signals required by the protocol to external interface controller 30A that causes external interface controller 30A to generate a corresponding response message or transaction and send it to processor 14.

With respect to FIG. 3, validate module 60 generates the response message which may include data and other signals required by the protocol and I/O module 64 sends the response message to external interface controller 30A over bus 33. I/O module 64 may wait for appropriate protocol on bus 33 before sending the response message. Validate module 60 may generate the response message after generating a status signal associated with the corresponding read transaction received from external interface controller 30A.

I/O module 52 receives the response message and sends it to transaction module 50. Transaction module 50 processes the response message and generates a corresponding response message that I/O module 52 sends to processor 14 over bus 31.

Test module 32A validates the response message generated by external interface controller 30A. In particular, I/O module 64 snoops bus 31 to retrieve the response message and validate module 60 validates the retrieved response message based on the associated data or whether or not the response message is consistent with the associated protocol. Validate module 60 outputs a status signal that indicates whether of not the response message is valid to complete the validation process.

Figure 4:
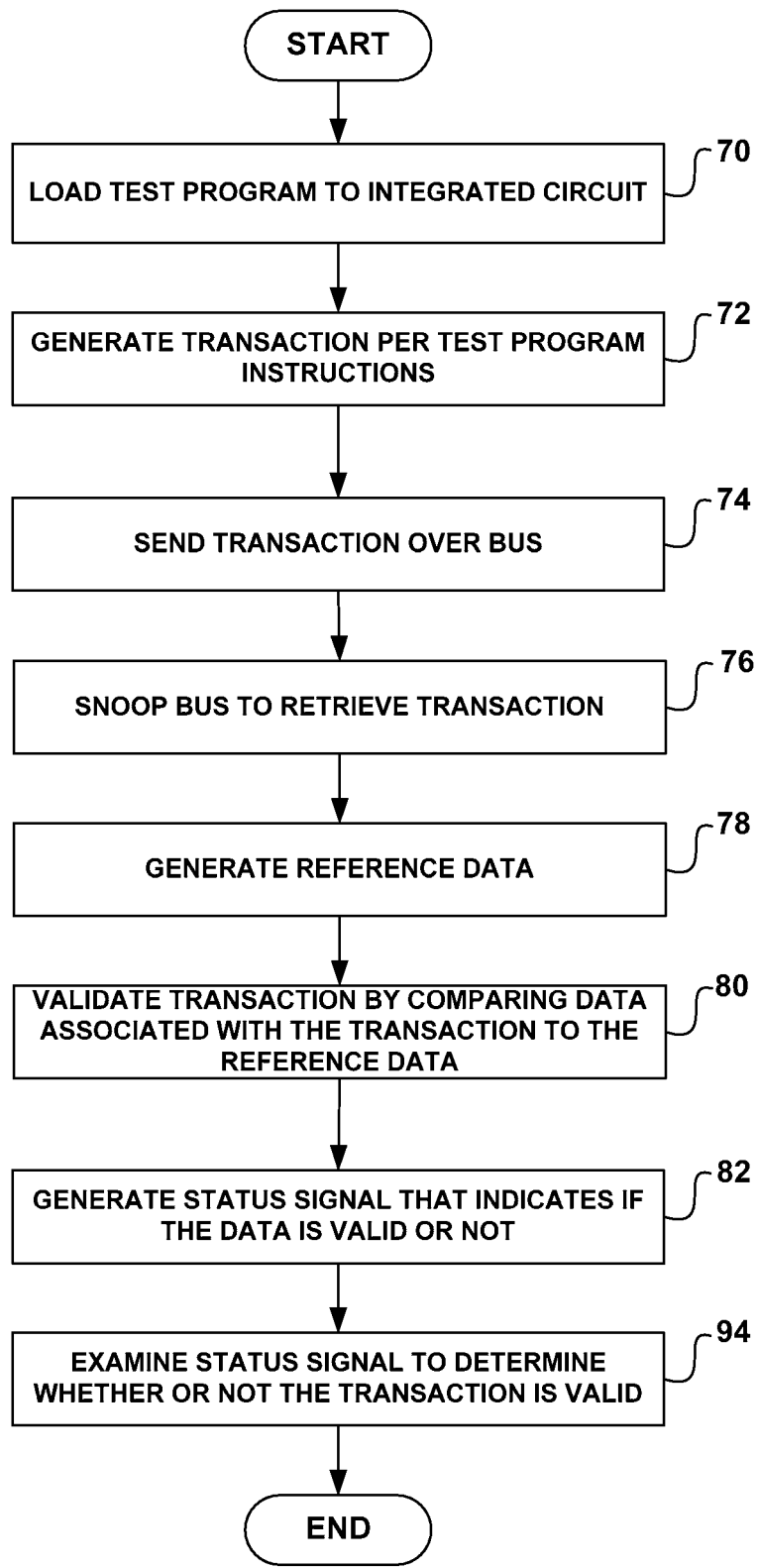
FIGS. 4 and 5 are flowcharts illustrating example self-test techniques that may be performed by the integrated circuit of FIG. 2.

FIG. 4 is a flowchart illustrating an example technique that may be executed by integrated circuit 12 to validate a transaction transmitted over a high frequency external interface based on data associated with the transaction. In general, the steps illustrated in FIG. 4 may be used to validate a transaction generated in a transmit mode or a receive mode and are described with respect to components of integrated circuit 12 illustrated in FIG. 3. The flowchart begins when integrated circuit 12 is mounted to test equipment 22 via pin interface 20 during post-manufacture testing. Initially, a host computer loads a test program to integrated circuit 12 (70). The test program may be developed on the host computer and loaded to program memory 42 of processor 14 via test equipment 22.

Processor 14 and external interface controller 30A generate transactions per test program instructions (72) and send the transaction over a bus (74). For example, steps 72 and 74 may refer to processor 14 sending a write transaction to external interface controller 30A over bus 31 or external interface controller sending a corresponding write transaction to an external device over bus 33 when operating in a transmit mode. In an example in which integrated circuit 12 operates in a receive mode, operations 72 and 74 may refer to processor 14 sending a read transaction to external interface controller 30A over bus 31, external interface controller 30A sending a corresponding read transaction to an external device, or external interface controller 30A sending a response message to processor 14. That is, operations 72 and 74 generally refer to a single transaction that is generated during the process of performing a read or write operation. Thus, it should be apparent that the operations of the flowchart illustrated in FIG. 4 may be repeated to validate a complete write or read operation.

Test logic module 32A snoops the appropriate bus, i.e., the bus over which the transaction is sent in operation 74, to retrieve or intercept the transaction (76). Thus, test logic module 32A may snoop bus 31 to validate transactions generated by processor 14 in transmit mode or receive mode and transactions generated by external interface controller 30A in receive mode and to validate the responses for such transactions, and snoop bus 33 to validate transactions generated by external interface controller 30A in transmit mode and receive mode. Because write and read operations require sending write and read transactions over busses 31 and 33, test logic module 32A generally snoops busses 31 and 33 to validate the complete signal path of the external interface.

Upon retrieving the transaction, test logic module 32A generates reference data (78) and validates the transaction by comparing data associated with the transaction to the reference data (80). Test logic module 32A may generate the reference data based on a seed value provided by processor 14 and, more specifically, the control signal received from processor 14. The control signal and, thus, the seed value may be transmitted over a dedicated wire connection or the corresponding bus.

Based on the comparison, test logic module 32A generates a status signal that indicates if the transaction is valid or not (82). Test logic module 32A may apply the status signal directly to an output of pin interface 20. The output may be coupled to a host computer with a display for viewing the status signal. Consequently, a user can examine the status to determine whether or not the transaction generated in step 72 is valid (84). Alternatively, the status signal may be received by processor 14 and used to set a value of a memory parameter that can be read out and displayed on the monitor.

Figure 5:
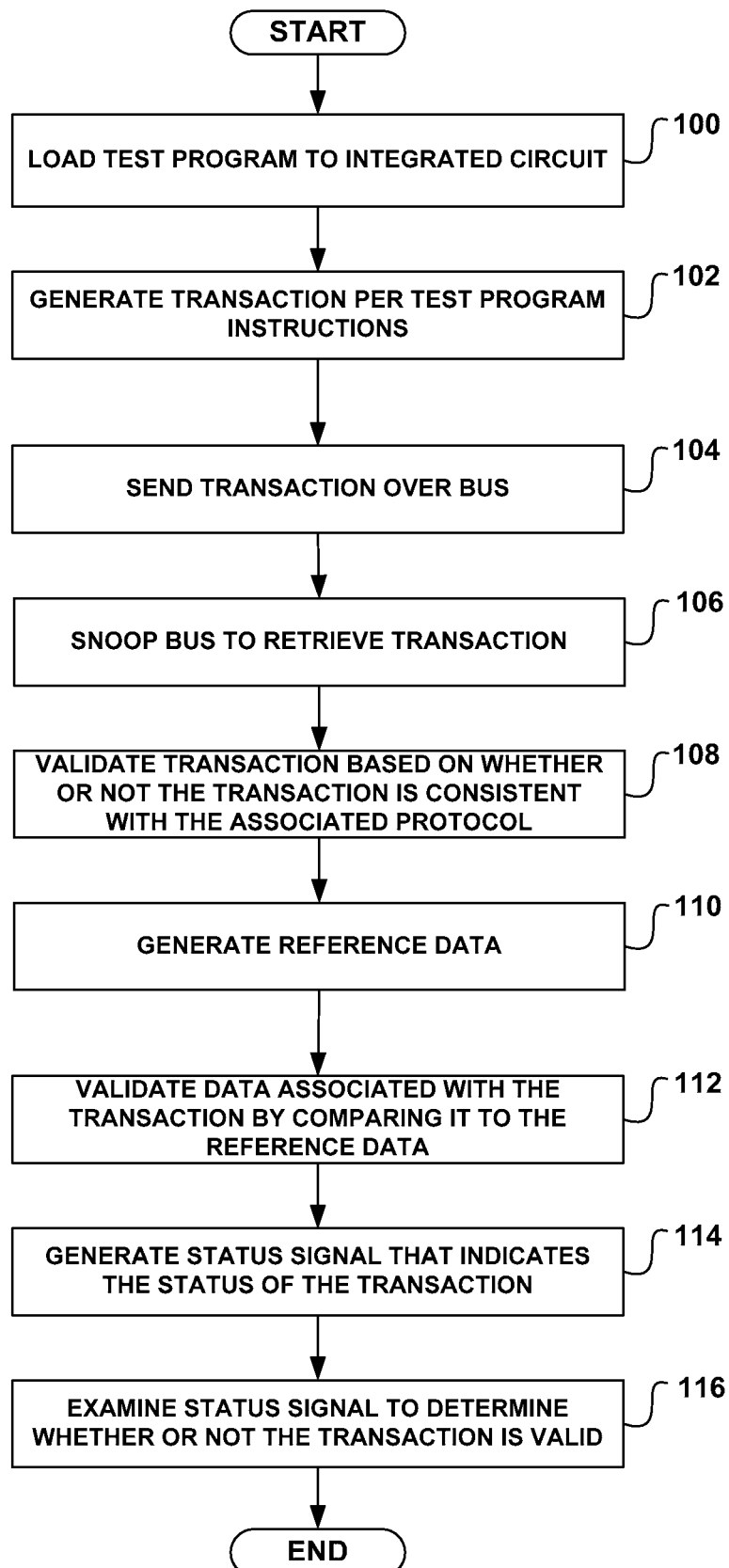

FIG. 5 is a flowchart illustrating an example technique that may be performed by integrated circuit 12 to validate a transaction transmitted over a high frequency external interface based on whether or not the transaction is consistent with the associated protocol. The steps illustrated in FIG. 5 may be used to validate a transaction generated in a transmit mode or a receive mode. Similar to the flowchart illustrated in FIG. 4, the steps of the flowchart illustrated in FIG. 5 are executed when integrated circuit 12 is mounted to test equipment 22 via pin interface 20 during post-manufacture testing.

Initially, a host computer loads test program 42 to integrated circuit 12 (100) via test equipment 22. Test program 42 is developed to test the functionality of external interfaces when operating in a transmit mode and a receive mode. Accordingly, integrated circuit 12 generates a transaction per test program instructions (102) and sends the transaction over a bus (104). Similar to FIG. 4, operations 102 and 104 refer to a single a read or write transaction generated by processor 14 or external interface controller 30A during a read or write operation. However, it should be understood that the operations of the flowchart in FIG. 5 can be repeated to validate multiple read and write transactions that are generated during read and write operations.

Snooping the bus to retrieve or intercept the transaction (106) may refer to test logic module 32A snooping the bus over which the transaction was transmitted in operation 102. Test logic module 32A may actively snoop the appropriate bus upon receiving a control signal from processor 14. Processor 14 may send the control signal to enable test logic module 32A when test program 42 is loaded to memory.

Upon retrieving the transaction, test logic module 32A validates the retrieved transaction based on whether or not the transaction is consistent with the associated protocol (108). For example, test logic module 32A may validate the transaction by checking one or more signals defined by the protocol. This may include checking the one or more states defined by signal or a sequence of states defined by one or more signals. For example, when the protocol defines a signal that indicates when data is being transferred, test logic module 32A may check this signal to determine whether or not data is being transferred at the time specified by the protocol. More generally, however, test logic module 32A examines the transaction to determine whether or not it satisfies the rules set forth by the protocol, i.e., is consistent with the protocol.

Test logic module 32A may then generate reference data (110), for example, based on a seed value provided by the control signal received from processor 14. Test logic module 32A validates data associated with the transaction by comparing it to the reference data (112). Thus, test logic module 32A can generate a status signal that indicates the status of the transaction (114). For example, test logic module 32A may generate the status signal to indicate that the transaction is consistent with the associated protocol and the data is valid, that the transaction is consistent with the associated protocol but the data is not valid, or that the transaction is not consistent with the protocol.

A user can then examine the status signal to determine whether or not the transaction is valid (116). As an example, the status signal may be output to a designated pin of pin interface 20 or may be used to set the value of a stored parameter in memory of processor 14. In either case, the status signal can be read out by test equipment 22 for display on a monitor of a host computer.

Various aspects and examples have been described. However, modifications can be made to the structure or techniques of this disclosure without departing from the scope of the following claims. For example, integrated circuits as described herein may be fabricated with various IC process technologies such as complementary metal oxide semiconductor (CMOS), bipolar junction transistor (BJT), bipolar-CMOS (BiCMOS), silicon germanium (SiGe), gallium arsenide (GaAs), and the like. These and other aspects of the disclosure are within the scope of the following claims.

The invention claimed is:

1. An integrated circuit comprising:
a processor operative to execute instructions of a test program, the processor operative to generate a message comprising data;
core logic circuitry operative to receive the message from the processor in accordance with the test program; and
test logic circuitry operative to snoop the message sent from the processor to the core logic circuitry and to evaluate the message and provide a status signal to the processor that indicates whether the message is valid.

2. The integrated circuit of claim 1, wherein the test logic circuitry is coupled to the processor via a first bus, and wherein the test logic circuit is further operative to snoop the first bus to detect the message sent from the processor to the core logic circuitry.

3. The integrated circuit of claim 2, further comprising;
an external interface configured to interface with an external device; and
a second bus coupling the external interface to the core logic circuitry, wherein the test logic circuitry is further operative to snoop the second bus to detect messages sent from the external device to the core logic circuitry via the external interface.

4. The integrated circuit of claim 3, wherein the message is communicated in accordance with a protocol, and wherein the test logic circuitry evaluates the message based on whether the message is consistent with the protocol and determines whether a number of communications sent via the first bus and the second bus during a particular time interval exceeds a threshold.

5. The integrated circuit of claim 1, wherein the test logic circuitry validates the message based on the data associated with the message.

6. The integrated circuit of claim 1, wherein the core logic circuitry is operative to be coupled to an external device via one of a peripheral component interconnect (PCI) bus, an advanced high-performance bus (AFIB), and an advanced extensible interlace (AXI) bus, a small computer system interface (SCSI) bus, an Ethernet bus, a universal serial bus (USB), an advanced graphics processor (AGP) bus, and a serial advanced technology attachment (SATA) bus.

7. The integrated circuit of claim 1,
wherein the message is a first message, wherein, when operating in a transmit mode, the core logic circuitry generates a second message based on the first message and sends the second message to an external device, and
wherein the test logic circuitry is operative to snoop the second message, and wherein the test logic circuitry evaluates the second message and provides a second status signal to the processor that indicates whether the second message is valid.

8. The integrated circuit of claim 1,
wherein the message is a first message, wherein, when operating in a receive mode, the core logic circuitry generates a second message based on the first message and sends the second message to an external device
wherein the test logic circuitry is operative to snoop the second message, wherein the test logic circuitry evaluates the second message and provides a second status signal to the processor that indicates whether the second message is valid, and
wherein the test logic circuitry is further operative to generate a third message based on the second message and to send the third message to the core logic circuitry to emulate the external device.

9. The integrated circuit of claim 8,
wherein the core logic circuitry is operative to generate a fourth message based on the third message and to send the fourth message to the processor, and
wherein the test logic circuitry evaluates the fourth message and provides a third status signal to the processor that indicates whether the fourth message is valid.

10. The integrated circuit of claim 1, wherein the test logic circuitry is operative to generate reference data, compare the reference data to the data associated with the message, and determine whether the message is valid based on the comparison.

11. The integrated circuit of claim 1, wherein the core logic circuitry generates a response message associated with the message and sends the response message to the processor, and wherein the test logic circuitry evaluates the response message and provides a second status signal to indicate whether the response message is valid.

12. The integrated circuit of claim 1, wherein the integrated circuit is configured for operation in one of a personal computer, a lap top computer, a personal digital assistant (PDA), an ultra mobile personal computer (UMPC), a wireless communication device, a networking device, and an electronic computing device.

13. The integrated circuit of claim 1, wherein the integrated circuit is configured to operate as a mobile station modem (MSM) chip in a wireless communication device.

14. A method comprising:
executing instructions of a test program in a processor on an integrated circuit;
generating a message comprising data in the processor to communicate with core logic circuitry of the integrated circuit in accordance with the test program;
sending the message from the processor to the core logic circuitry;
snooping the message at test logic circuitry of the integrated circuit;
evaluating the message at the test logic circuitry to determine whether the message is valid; and
providing a status signal from the test logic circuitry to the processor that indicates whether the message is valid.

15. The method of claim 14, wherein the core logic circuitry is configured to operate at a frequency greater than approximately 200 MHz.

16. The method of claim 14, wherein the core logic circuitry is configured to operate at a frequency greater than approximately 400 MHz.

17. The method of claim 14, wherein the message is communicated in accordance with a protocol, and wherein evaluating the message comprises evaluating the message at the test logic circuitry based on whether the message is consistent with the protocol.

18. The method of claim 14, wherein evaluating the message comprises evaluating the message at the test logic circuitry based on the data associated with the message.

19. The method of claim 14, wherein the core logic circuitry is operative to be coupled to an external device via one of a peripheral component interconnect (PCI) bus, an advanced high-performance bus (AHB), and an advanced extensible interface (AXI) bus, a small computer system interlace (SCSI) bus, an Ethernet bus, a universal serial bus (USB), an advanced graphics processor (AGP) bus, and a serial advanced technology attachment (SATA) bus.

20. The method of claim 14, wherein executing instructions comprises executing instructions of the test program in the processor to initiate operation in a transmit mode, the method further comprising:
generating a second message in the core logic circuitry based on the message;
sending the second message to a pin interface of the integrated circuit for providing the message to an external device;
snooping the second message at the test logic circuitry;
evaluating the second message at the test logic circuitry to determine whether the second message is valid; and
providing a second status signal from the test logic circuitry to the processor that indicates whether the second message is valid.

21. The method of claim 14, wherein executing instructions comprises executing instructions of the test program in the processor to initiate operation in a receive mode, the method further comprising:
generating a second message in the core logic circuitry based on the message;
sending the second message from the core logic circuitry to a pin interface of the integrated circuit for providing the second message to an external device;
snooping the second message at the test logic circuitry;
generating a third message at the test logic circuitry based on the second message; and
sending the third message from the test logic circuitry to the core logic circuitry, wherein the test logic circuitry emulates the external device.

22. The method of claim 21, further comprising:
generating a fourth message in the core logic circuitry based on the third message;
sending the fourth message from the core logic circuitry to the processor;
snooping the fourth message at the test logic circuitry;
evaluating the fourth message at the test logic circuitry to determine whether the fourth message is valid; and
providing a second status signal from the test logic circuitry to the processor that indicates whether the fourth message is valid.

23. The method of claim 14, wherein evaluating the message at the test logic circuitry further comprises generating reference data, comparing the reference data to the data associated with the message, and determining whether the message is valid based on the comparison.

24. The method of claim 14, further comprising generating a response message in the core logic circuitry that is associated with the message, sending the response message to the processor, evaluating the response message at the test logic circuitry, and generating a second status signal at the test logic circuitry that indicates whether the response message is valid.

25. The method of claim 14, wherein the integrated circuit is configured for operation in one of a personal computer, a lap top computer, a personal digital assistant (PDA), an ultra mobile personal computer (UMPC), a mobile handset, a networking device, and an electronic computing device.

26. An integrated circuit comprising:
    means for executing instructions of a test program on an integrated circuit to initiate operation in one of a transmit mode and a receive mode;
    means for generating a message comprising data in a processor to communicate with core logic circuitry of the integrated circuit in accordance with the test program;
    means for sending the message from the processor to the core logic circuitry;
    means for snooping the message at test logic circuitry of the integrated circuit;
    means for evaluating the message at the test logic circuitry to determine whether the message is valid; and
    means for providing a status signal from the test logic circuitry to the processor that indicates whether the message is valid.

27. The integrated circuit of claim 26, wherein the means for executing instructions comprises means for executing instructions of the test program in the processor to initiate operation in the transmit mode, the integrated circuit further comprising:
    means for generating a second message at the core logic circuitry based on the message;
    means for sending the second message to a pin interface of the integrated circuit for providing the message to an external device;
    means for snooping the second message at the test logic circuitry;
    means for evaluating the second message at the test logic circuitry to determine whether the second message is valid; and
    means for providing a second status signal from the test logic circuitry to the processor that indicates whether the second message is valid.

28. The integrated circuit of claim 26, wherein the means for executing instructions comprises means for executing instructions of the test program in the processor to initiate operation in the receive mode, the integrated circuit further comprising:
    means for generating a second message at the core logic circuitry based on the message;
    means for sending the second message from the core logic circuitry to a pin interface for providing the second message to an external device;
    means for snooping the second message at the test logic circuitry;
    means for generating a third message at the test logic circuitry based on the second message; and
    means for sending the third message from the test logic circuitry to the core logic circuitry, wherein the test logic circuitry emulates the external device.

29. The integrated circuit of claim 28, further comprising:
    means for generating a fourth message at the core logic circuitry based on the third message;
    means for sending the fourth message from the core logic circuitry to the processor;
    means for snooping the fourth message at the test logic circuitry;
    means for evaluating the fourth message at the test logic circuitry to determine whether the fourth message is valid; and
    means for providing a second status signal from the test logic circuitry to the processor that indicates whether the fourth message is valid.

30. The integrated circuit of claim 26, wherein the means for evaluating the message at the test logic circuitry further comprises means for generating reference data, means for comparing the reference data to the data associated with the message, and means for determining whether the message is valid based on the comparison.

31. The integrated circuit of claim 26, further comprising means for generating a response message at the core logic circuitry that is associated with the message, means for sending the response message to the processor, means for evaluating the response message at the test logic circuitry, and means for generating a second status signal at the test logic circuitry that indicates whether the response message is valid.

32. A non-transitory computer-readable medium storing instructions executable by a computer, the instructions comprising:
    instructions that are executable by the computer to initiate operation in one of a transmit mode and a receive mode;
    instructions that are executable by the computer to generate a message comprising data of a processor to communicate with core logic circuitry of an integrated circuit in accordance with a test program;
    instructions that are executable by the computer to send the message from the processor to the core logic circuitry;
    instructions that are executable by the computer to snoop the message at test logic circuitry of the integrated circuit;
    instructions that are executable by the computer to evaluate the message at the test logic circuitry to determine whether the message is valid; and
    instructions that are executable by the computer to provide a status signal from the test logic circuitry to the processor that indicates whether the message is valid.

33. The non-transitory computer-readable medium of claim 32, further comprising:
    instructions that are executable by the computer to generate a second message at the core logic circuitry based on the message;
    instructions that are executable by the computer to snoop the second message at the test logic circuitry;
    instructions that are executable by the computer to evaluate the test logic circuitry to determine whether the second message is valid; and
    instructions that are executable by the computer to provide a second status signal from the test logic circuitry to the processor that indicates whether the second message is valid.

34. The non-transitory computer-readable medium of claim 32, further comprising:
    instructions that are executable by the computer to generate a second message at the core logic circuitry based on the message;
    instructions that are executable by the computer to send the second message from the core logic circuitry to a pin interface for providing the second message to an external device;
    instructions that are executable by the computer to snoop the second message at the test logic circuitry;
    instructions that are executable by the computer to generate a third message at the test logic circuitry based on the second message; and instructions that are executable by the computer to send the third message from the test logic circuitry to the core logic circuitry, wherein the test logic circuitry emulates the external device.

35. The non-transitory computer-readable medium of claim 34, further comprising:
instructions that are executable by the computer to generate a fourth message at the core logic circuitry based on the third message;
instructions that are executable by the computer to send the fourth message from the core logic circuitry to the processor;
instructions that are executable by the computer to snoop the fourth message at the test logic circuitry;
instructions that are executable by the computer to evaluate the fourth message at the test logic circuitry to determine whether the fourth message is valid; and
instructions that are executable by the computer to provide a second status signal from the test logic circuitry to the processor that indicates whether the fourth message is valid.

36. The non-transitory computer-readable medium of claim 32, wherein the instructions that are executable by the computer to evaluate the message at the test logic circuitry further comprise:
instructions that are executable by the computer to generate reference data;
instructions that are executable by the computer to compare the reference data to the data associated with the message; and
instructions that are executable by the computer to determine whether the message is based on the comparison.

37. The non-transitory computer-readable medium of claim 32, further comprising:
instructions that are executable by the computer to generate a response message at the core logic circuitry that is associated with the message;
instructions that are executable by the computer to send the response message to the processor;
instructions that are executable by the computer to evaluate the response message at the test logic circuitry; and
instructions that are executable by the computer to generate a second status signal the test logic circuitry that indicates whether the response message is valid.

38. A system comprising:
an integrated circuit including:
a processor operative to execute instructions of a test program, the processor operative to generate a first message comprising data;
an interface controller coupled to the processor via a bus, the interface controller operative to receive the first message from the processor via the bus in accordance with the test program; and
test logic circuitry external to the processor and the interface controller, the test logic circuitry coupled to the bus, the test logic circuitry operative to intercept the first message sent via the bus, wherein the test logic circuitry evaluates the first message and provides a status signal to a pin interface that indicates whether the first message is valid based on the evaluation.

39. The system of claim 38, wherein the first message is communicated in accordance with a protocol, and wherein the test logic circuitry evaluates the first message based on whether the first message is consistent with the protocol.

40. The system of claim 38, wherein the test logic circuitry evaluates the first message based on the data associated with the first message.

41. The integrated circuit of claim 1, wherein the processor executes instructions of the test program in a receive mode, wherein the test logic circuitry sends a second message comprising second data associated with a protocol to the core logic circuitry based on a seed value at the test logic circuitry provided by the processor.

42. The integrated circuit of claim 41, wherein the core logic circuitry generates a third message based on the second data received front the test logic circuitry.

43. The integrated circuit of claim 1, wherein the test logic circuitry includes a pseudo random data generator that receives a seed value from the processor and generates second data, wherein the second data matches test data specified by the test program.

44. The integrated circuit of claim 43, wherein the test logic circuitry includes validate circuitry, wherein the validate circuitry compares the second data to the data snoop front the message to determine whether the message is valid.

45. The method of claim 14, wherein the processor executes instructions of the test program in a receive mode, the method further comprising:
sending a second message comprising second data as required by a protocol from the test logic circuitry to the core logic circuitry, the second message based on a seed value at the test logic circuitry provided by the processor.

46. The method of claim 45, further comprising:
generating a third message at the core logic circuitry based on the second data received from the test logic circuitry.

47. The method of claim 14, further comprising:
receiving a seed value at a pseudo random data generator of the test logic circuitry from the processor; and
generating second data corresponding to a second message, at the pseudo random data generator, that matches test data specified by the test program.

48. The method of claim 47, further comprising:
comparing, at a validate module of the test logic circuitry, the second data to the data snoop from the message to determine whether the message is valid.

49. The system of claim 38, wherein the interface controller generates a second message based on the first message and sends the second message to an external device via a second bus, wherein the test logic circuitry is coupled to the second bus, the test logic circuitry operative to intercept the second message via the second bus, wherein the test logic circuitry evaluates the second message and provides a second status signal to the pin interface that indicates whether the second message is valid, and wherein the test logic circuitry is further operative to generate a third message based on the second message and to send the third message to the interface controller via the second bus to emulate the external device.

50. The system of claim 49, wherein the interface controller is operative to generate a fourth message based on the third message and to send the fourth message to the processor via the bus, and wherein the test logic circuitry evaluates the fourth message and provides a third status signal to the pin interface that indicates whether the fourth message is valid.

51. The integrated circuit of claim 1, further comprising a memory operative to store a status indication corresponding to an external device, wherein in response to receiving the status signal the processor is further operative to update the status indication based on the status signal, and wherein the status indication indicates a valid status of the message, a protocol error of the message, a data error of the message, or a combination thereof.

52. The integrated circuit of claim 3, wherein the core logic circuitry includes an external interface controller configured to manage communications sent between the processor and the external device.

53. The system of claim 49, wherein the first message is associated with a first protocol, and wherein the second message is associated with a device protocol of the external device.

* * * * *